(12) United States Patent
Hiang et al.

(10) Patent No.: US 7,439,084 B2
(45) Date of Patent: Oct. 21, 2008

(54) PREDICTIONS OF LEAKAGE MODES IN INTEGRATED CIRCUITS

(75) Inventors: Tang Kok Hiang, Singapore (SG); Ming-Ta Lei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 284 days.

(21) Appl. No.: 11/405,650

(22) Filed: Apr. 17, 2006

(65) Prior Publication Data

US 2007/0196934 A1    Aug. 23, 2007

Related U.S. Application Data

(60) Provisional application No. 60/774,365, filed on Feb. 17, 2006.

(51) Int. Cl.
*H01L 21/66* (2006.01)
*G01R 31/26* (2006.01)

(52) U.S. Cl. .................................................. 438/14
(58) Field of Classification Search ............. 438/10–18; 257/432

See application file for complete search history.

(56) References Cited

U.S. PATENT DOCUMENTS 6,365,423 B1 * 4/2002 Heinlein et al. ............... 438/14
6,815,345 B2 * 11/2004 Zhao et al. .................. 438/657

* cited by examiner

*Primary Examiner*—Calvin Lee
(74) *Attorney, Agent, or Firm*—Slater & Matsil, L.L.P.

(57) ABSTRACT

A method for determining leakage currents in integrated circuits is provided. The method includes providing a substrate comprising a target structure having a first region and a second region, grounding the second region, scanning the substrate using a scanning electron microscope to produce a voltage contrast (VC) image, determining a gray level of the first region in the VC image, and using the gray level to determine a leakage current between the first region and the second region.

19 Claims, 4 Drawing Sheets

PREDICTIONS OF LEAKAGE MODES IN INTEGRATED CIRCUITS

This application claims priority to provisional patent application Ser. No. 60/774,365, filed Feb. 17, 2006, and entitled "Predictions of Leakage Modes in Integrated Circuits," which application is hereby incorporated herein by reference.

TECHNICAL FIELD

This invention relates generally to a method for determining leakage currents in integrated circuits, and more particularly to a method for determining leakage currents using scanning electron microscopy.

BACKGROUND

Scanning electron microscopy (SEM) or electron probe microanalysis (EPMA) are micro-analytical techniques, which provide the ability to image or analyze materials that are typically non-observable with the resolution offered by visible techniques. The imaging capability allows for the photographing of an object much smaller than what can be seen even with the aid of an optical microscope, while the analyzing ability allows for the identification of the elements (e.g., silicon, iron, etc.) of which the specimen is composed.

Scanning electron microscopes have generally been used as cameras for photographing specimens beyond the capabilities of ordinary optical microscopes. While the images obtained appear very real and as if they were photographed by ordinary means, the apparent illumination is a function of particle emission rather than radiation. These emitted particles are termed secondary electrons (SE). Secondary electrons are produced within the specimen as a result of primary eBeam electrons interacting with weakly bonded electrons within the specimen. Secondary electrons are emitted from the surface and detected.

The detection of secondary electrons via a SE detector is displayed on a scanning TV display. A bright image is the result of high secondary electron emission, and the primary influence on SE emission is the surface structure of the specimen. The end result is therefore brightness associated with surface characteristics and an image that looks very much like a normally illuminated subject.

Scanning electron microscopes have been widely used for integrated circuits, which have increasingly small scales beyond the capability of optical microscopes. However, scanning electron microscopes have mainly been used for the imaging of surface structures, and few efforts have been concentrated on the research of viewing the characteristics of the integrated circuits related to the internal structures. Further explorations to extend the capability of scanning electron microscopes thus have become a necessity.

SUMMARY OF THE INVENTION

In accordance with one aspect of the present invention, the method is used for determining a leakage current between a first region and a second region. The method includes grounding a second region, scanning a substrate using a scanning electron microscope to produce a voltage contrast (VC) image, determining a gray level of a first region in the VC image, and using the gray level to determine the leakage current between the first region and the second region. The second region can be virtually grounded or connected to the electrical ground.

In accordance with another aspect of the present invention, a calibration process is performed to construe a correlation between gray levels and leakage currents. The calibration process includes selecting a plurality of sample structures, using a scanning electron microscope to produce VC images, determining gray levels of the sample structures from the VC images, measuring leakage currents of the sample structures, and establishing a correlation using the gray levels and the leakage currents.

In accordance with yet another aspect of the present invention, the preferred embodiments of the present invention are used to determine leakage currents in MOS devices. By producing VC images of the MOS devices, gray levels of electrodes and source/drain (silicide) regions are obtained. Leakage currents flowing between the gate electrodes and the substrate and leakage currents flowing between the source/drain silicide regions and the substrate can thus be determined.

The preferred embodiments provide a shortened feedback time, so that the culprit processes can be quickly identified and modified. Since the magnitudes of the leakage currents are determined, process adjustment can be performed more precisely.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Conventionally, the magnitudes of leakage currents in integrated circuits are measured through wafer-level measurements, which are performed after the wafers are fabricated. This results in a long time lag from the time when the culprit process step is performed to the time when the feedback is provided. Root cause analysis is thus delayed. To quickly optimize fabrication processes, it is desired that immediately after a feature is fabricated, the leakage current of the feature can be determined.

The preferred embodiments of the present invention provide a novel method for determining leakage levels in integrated circuits. The concepts of the preferred embodiments of the present invention are explained using a metal-oxide-semiconductor (MOS) device. The applications of the preferred embodiments are then discussed. One skilled in the art will recognize that the present invention is applicable to a wide range of structures and technologies beyond the illustrated embodiments.

Figure 1:
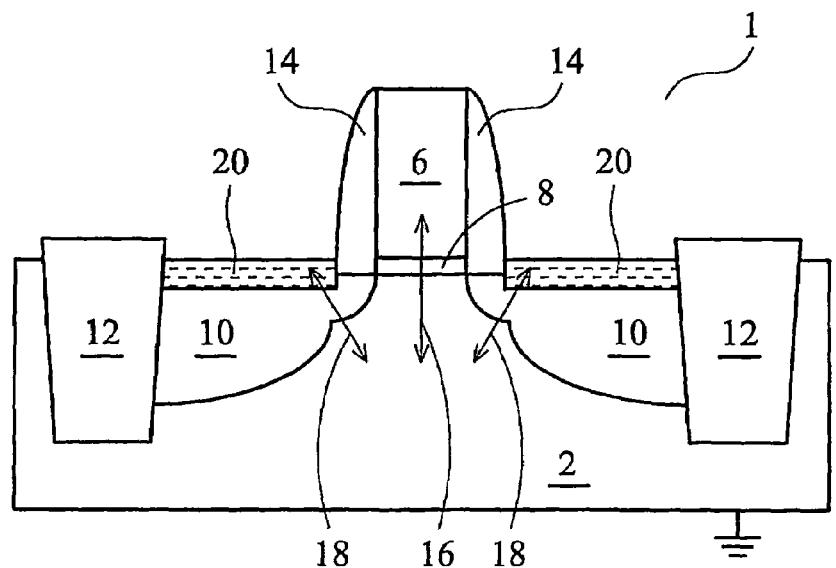
FIG. 1 illustrates a MOS device and leakage currents.

FIG. 1 illustrates a MOS device 1, which includes a gate dielectric 8 formed on a semiconductor substrate 2, a gate electrode 6 on gate dielectric 8, spacers 14 on sidewalls of gate electrode 6 and gate dielectric 8, source/drain regions 10, and silicide regions 20 on source/drain regions 10. A gate silicide region (not shown) may be formed on the gate electrode 6. Shallow trench isolation regions 12 isolate the MOS device 1 from the remaining portions of the integrated circuit.

Two types of leakage currents are shown in FIG. 1. Leakage current 16 flows between gate electrode 6 and substrate 2 through gate dielectric 8. Leakage currents 18 are junction leakage currents flowing between the source/drain regions 10 and substrate 2.

In the preferred embodiment, after the formation of gate electrode 6 and silicide regions 20, but before the formation of a contact etch stop layer and inter-layer dielectric layer (not shown), substrate 2 is grounded, and a scanning electron microscope (SEM) analysis is performed on the wafer on which the MOS device 1 is fabricated. In alternative embodiments, the SEM is performed after the source/drain regions 10 are formed but before the silicide regions 20 are formed. When the wafer is scanned with an eBeam, secondary electrons are generated and emitted from the surfaces of the wafer. The data of the secondary electrons is converted to a voltage contrast (VC) image, which shows the brightness of the respective features on the wafer. Throughout the description, a term "gray level" is alternatively used to indicate the brightness, and a high gray level represents a high brightness.

EBeam scanning will cause the respective surfaces of gate electrode 6 and silicide regions 20 to be positively or negatively charged depending on the total electron yield associated with the material as well as the immediate field conditions. Sustained positive charges tend to attract the consequent secondary electrons back to the surface, thus the corresponding features appear relatively dark, while negatively charged surfaces repel the secondary electrons so that the features appear relatively bright. The surface voltage varies with the amount of surface-accumulated charges. The detected secondary electron signal is thus a function of the surface voltage caused by the accumulated charges.

The ability to sustain charges, hence the surface voltage, of the region being scanned is associated with the insulative ability of the underlying materials. Taking gate electrode 6 as an example, when it is scanned, charges are accumulated thereon. However, the amount of accumulated charges is affected by the leakage current from gate electrode 6 to substrate 2 through gate dielectric 8. The higher the leakage current, the fewer charges that are accumulated. As a result, there is a correlation between the gray level of gate electrode 6 in the respective VC image and the leakage current 16. Similarly, correlation also exists between the source/drain leakage currents 18 and the respective gray levels of the source/drain regions in the VC image of the wafer.

Due to the correlation between gray levels and leakage currents, the gray levels can be used to determine the leakage currents of the respective features. A greater leakage current is typically associated with a higher gray level in the VC image. Therefore, if a leakage current is higher than other source/drain regions of other similar devices, the respective source/drain regions appear brighter than source/drain regions of other MOS devices. The leakage current can be estimated based on relative gray levels. If a first and a second feature have a first gray level and a second gray level respectively, and the second gray level is greater than the first gray level, the leakage current of the second feature can be determined based on the leakage current of the first feature and a ratio of the second gray level to the first gray level.

Figure 2:
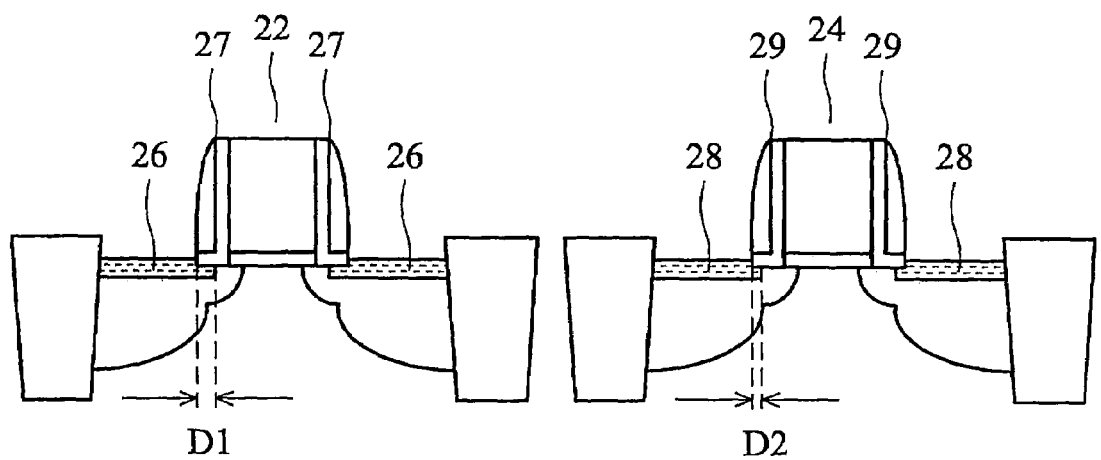
FIG. 2 illustrates schematic cross-sectional views of two MOS devices, wherein silicide regions of the MOS devices encroach under the respective gate spacers.

FIG. 2 illustrates schematic cross-sectional images of two MOS devices. The TEM image of MOS device 22 shows that silicide regions 26 of the MOS device encroach under the respective gate spacers 27 for a distance D1 of about 429 Å, while the TEM image of MOS device 24 shows its silicide regions 28 encroaching under the respective spacers 29 for a distance D2 of about 200 Å. As is known in the art, greater encroachment results in a smaller distance between the silicide regions and respective junctions, and hence a greater leakage current. Therefore, it is expected that the gray level of the source/drain or silicide regions of MOS device 22 will be higher than that of the MOS device 24. This expected result has been observed in the VC images of the MOS devices 22 and 24, wherein the gray levels of the source/drain regions of MOS device 22 are 177, while the gray levels of the source/drain regions of MOS device 24 are 147. Correspondingly, the leakage currents in MOS device 22 are in the orders of nano-amperes or greater; while the leakage currents in MOS device 24 are in the order of pico-amperes or smaller.

In order to quantify the leakage current, a calibration process is needed, through which a correlation between leakage currents and gray levels is construed. The correlation may be represented in the form of graphs, lookup tables or equations, wherein leakage currents are expressed as the functions of gray levels. Since the correlation depends on the structure and materials used, sample features used for construing the correlation are preferably substantially similar to the features whose leakage currents are to be determined.

For construing the correlation between leakage currents and gray levels, multiple sample points are collected. In the preferred embodiment, no sample structures are formed and sample points are collected on wafers from the production line. For each wafer, after the gate electrodes and silicide regions are formed, a SEM is performed to produce a VC image of the wafer. Gray levels are determined from the VC image. Leakage currents of the respective MOS devices are measured during a wafer-level test, which is performed after the fabrication is finished. Sample points are thus accumulated while the fabrication proceeds. After enough sample points covering the desired range of leakage currents are collected, the correlation can be established, for example, by marking sample points on a graph and drawing a fit line.

In an alternative embodiment, one or more sample wafers are fabricated. Each sample wafer preferably includes multiple groups of devices having similar structures, wherein leakage currents are different from group to group. In an exemplary embodiment, different groups have different pattern densities. Due to micro-loading effects, variations occur, causing different leakage currents in different groups. For example, micro-loading effects cause different thicknesses and material densities in gate dielectrics, resulting in different gate leakage currents in different regions. Micro-loading effects also cause source/drain silicide regions to encroach under the gate spacers for different distances, resulting in different leakage currents between source/drain silicide regions and the substrate. In this embodiment, sample points are collected from different groups, maybe even from different sample wafers, to construe the correlation.

It is to be noted that the correlation of the gray levels and leakage currents are related to structures and materials. Therefore, similar structures having similar dimensions and materials are to be used for the calibration process.

After being construed, the correlation can be used to determine leakage currents of components in integrated circuits immediately after the components are fabricated. For example, after the fabrication of the gate electrodes and the source/drain regions of the MOS devices, a VC image is taken. If a higher-than-normal gray level is found on a gate electrode or a source/drain region, it can be determined that the respective region has an abnormal leakage current. The magnitude of the leakage current can be determined using the gray level and the correlation. Root causes can then be analyzed, and fabrication processes may be adjusted if necessary. The preferred embodiments of the present invention make it possible to determine the amount of adjustment needed by determining the magnitude of the leakage current. This significantly shortens the feedback time, allowing a quick adjustment to optimize fabrication processes of integrated circuits.

Usage of the preferred embodiments of the present invention is not limited to the determination of leakage currents in MOS devices. Generally, the preferred embodiments of the present invention can be used to determine a leakage current between two regions by grounding one region and scanning the other. A schematic illustration of a target structure is provided in FIG. 3, wherein regions 30, 32 and 34 are vertically located. Regions 30 and 34 are preferably conductive. A leakage current 36 flowing through the region 32 can be determined based on the respective gray level. Preferably, region 32 has a low-conductivity. The reason is that when the conductivity of region 32 is high, the leakage current 36 is also high, and the corresponding gray level of region 30 in the VC image may reach the maximum value of the SEM. It is appreciated that the term "low-conductivity" is a term of art. Preferably, if the resulting gray level of the region 30 in the VC image is lower than the maximum gray level, region 32 may be considered to be a low-conductivity region.

Feature 34 is preferably grounded. Throughout the description, the term "grounded" is used to refer to a feature being connected to the electrical ground or being virtually grounded. When a feature has a relatively high capacity for storing charge, so that during eBeam scanning, the potential of the respective feature is substantially stable, the feature is considered to be virtually grounded, although it is not necessarily connected to the electrical ground. Alternatively, a conductive feature connected to another feature having a great charge storing capacity is also considered virtually grounded. In the preferred embodiment, feature 34 is connected to the electrical ground.

To achieve a desired gray level, enough charges have to be accumulated in a short time. An index is thus needed to evaluate the amount of charges provided by the eBeam. In the preferred embodiment, an index equaling the scanning current multiplied by the time for scanning a pixel is used. In an exemplary embodiment, the index is preferably between about $1 \text{ nA} \ast 10^{-9}$ seconds and about $100 \text{ nA} \ast 10^{-9}$ seconds, and more preferably between about $10 \text{ nA} \ast 10^{-9}$ seconds and about $100 \text{ nA} \ast 10^{-9}$ seconds, and even more preferably about $11 \text{ nA} \ast 10^{-9}$ seconds.

If the gray levels of the tested structures are too high or too low due to either over-saturation of secondary electrons or inadequate secondary electrons, SEM parameters such as the eBeam current can be adjusted to bring the gray levels into the desired range. In an exemplary embodiment, the eBeam preferably has a landing energy of greater than about 50 eV and less than a maximum allowable landing energy limited by the hardware that provides the eBeam, and a scanning current of between about 1nA and about 100 nA. The size of the tested structure also affects the saturation of secondary electrons, and hence the gray levels in the VC images. Therefore, the gray level of a region can be improved by reducing the area of the region. In an exemplary embodiment, the scanned region has an area of less than about 0.05 $\mu m^2$ to allow for a quick saturation of secondary electrons in the SEM process.

Figure 3:
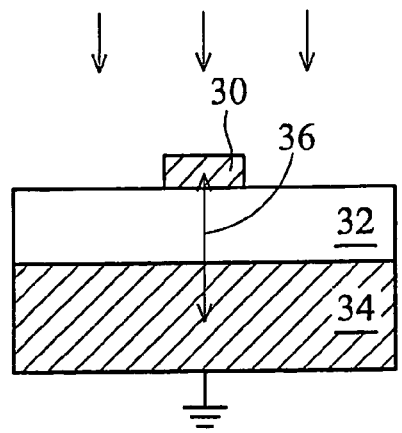
FIGS. 3, 4 and 5 illustrate leakage currents in several structures, wherein the leakage current in these structures can be determined using the preferred embodiments of the present invention.
Figure 4:
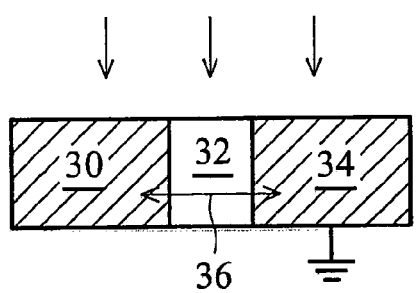

FIG. 4 illustrates a variation of the embodiment shown in FIG. 3, wherein regions 30, 32 and 34 are horizontally located. When the region 34 is preferably grounded and the wafer is scanned, the leakage current 36 affects the gray level of region 30. Therefore, by determining the gray level of region 30, the leakage current 36 can be determined.

Figure 5:
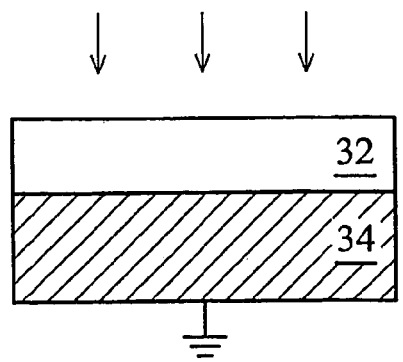

In a variation of the preferred embodiment, as shown in FIG. 5, eBeam is scanned on the insulation layer 32 directly, and the gray levels in the respective VC image reflect the leakage currents of the pixels scanned. This case is equivalent to the case shown in FIG. 3 with the conductor 30 having a size equal to a pixel (or resolution) of the eBeam. If any spot in the VC image has a high gray level, it may indicate a leakage path between this spot and the region 34. The severity of the leakage current can be determined through the gray level.

Figure 6A:
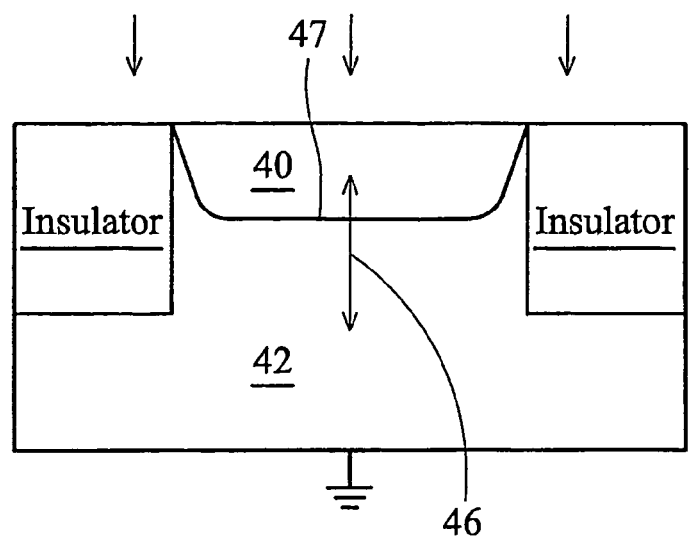
FIGS. 6A and 6B illustrate the determination of a leakage current flowing through a p-n junction.

The preferred embodiments of the present invention can also be used for determining leakage current in p-n junctions. Referring to FIG. 6A, a substrate 42 has a first conductivity type. An implant region 40, which has a second conductivity type the opposite of the first conductivity type, is formed in the substrate 42. A p-n junction is thus formed at the interface region 47. The leakage current 46 flowing through the p-n junction can be determined using the previously discussed method. In this embodiment, regions 40 and 42 can be of p-type or n-type, respectively. Conversely, regions 40 and 42 can be of n-type or p-type, respectively. Note that the embodiment shown in FIG. 6A can be found in FIG. 1, wherein the p-n junction (not shown) is located between one of the source/drain regions 10 and substrate 2.

Figure 6B:
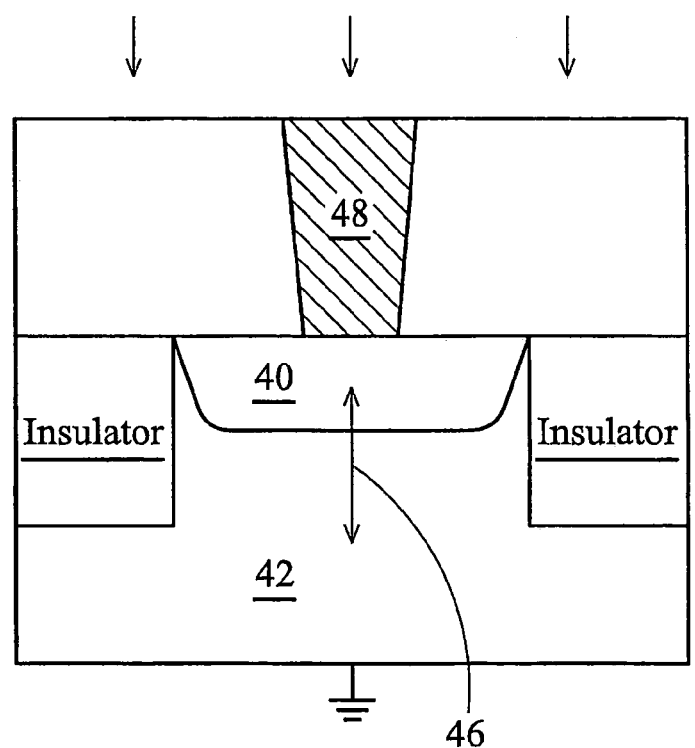

In the preferred embodiment as previously discussed, the leakages are detected immediately after the respective features are fabricated. In other embodiments, the leakage can be detected after the formation of e.g., contact plugs. An example is shown in FIG. 6B, wherein a contact plug 48 connects to the implant region 40. The gray level of the contact plug 48 in the respective image reflects the leakage current 46 of the p-n junction. In yet other embodiments, the leakage current 46 can be determined even after metallization layers and vias are formed, and the leakage current 46 may be determined using the gray level of the metal feature that connects to the p-n junction, providing that the metal feature's scanned region has an area of less than about 1.5 $\mu m^2$ to allow for a quick saturation of secondary electrons in the SEM process.

Figure 7:
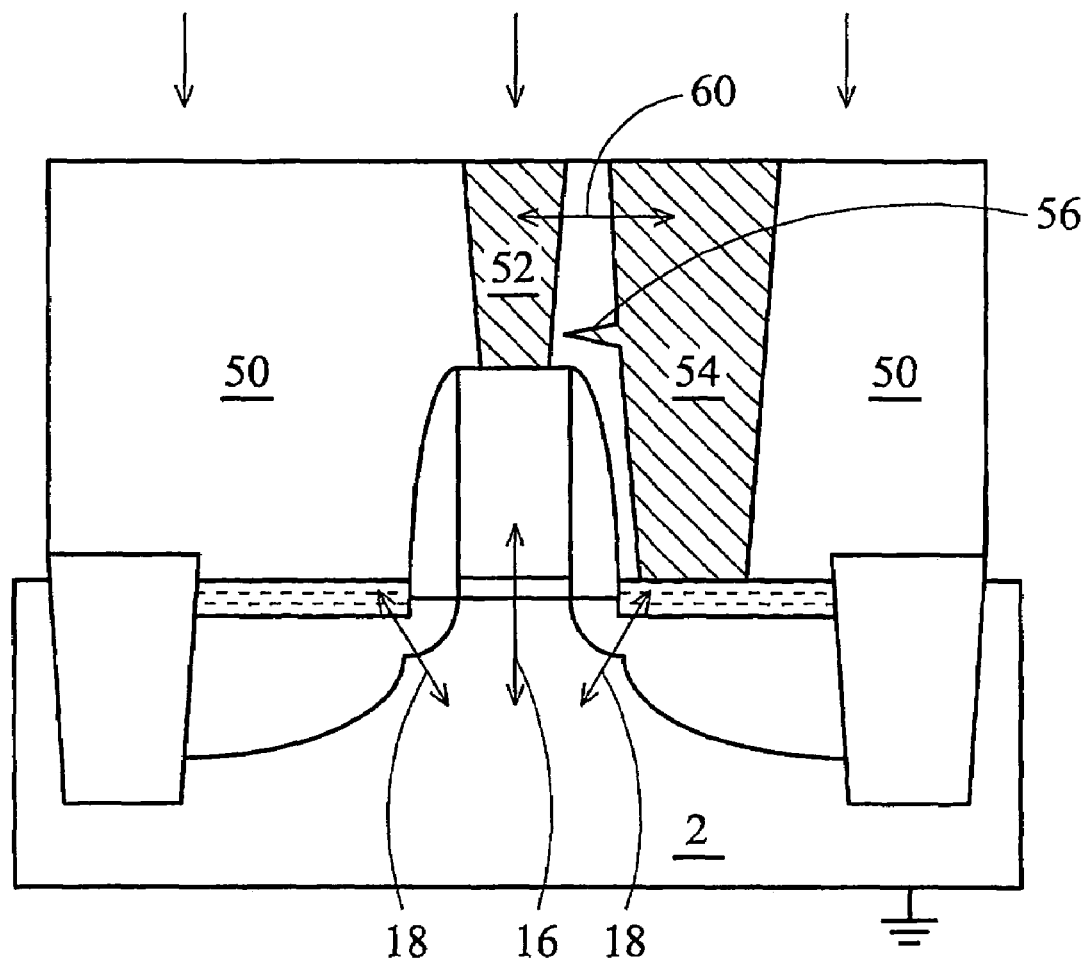
FIG. 7 illustrates the determination of the leakage currents of a MOS device after the formation of contact plugs.

The leakage currents in a MOS device can also be determined after the formation of contact plugs, as shown in FIG. 7. If substrate 2 is grounded or virtually grounded, leakage currents 16 and 18 can be determined based on the gray levels of contact plugs 52 and 54, respectively. If one of the contact plugs 52 and 54 is grounded, the gray level of the other contact plug in the VC image can be used to determine a leakage current 60 between contact plugs 52 and 54 (as well as regions connected to them). A high leakage current may indicate the presence of structural defects, such as the metal extrusion 56.

The preferred embodiments of the present invention have several advantageous features. By determining leakage currents during the fabrication process, feedback time is significantly shortened. Also, being able to determine the magnitudes of the leakage currents allows process adjustment to be performed more precisely.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for determining a leakage current in an integrated circuit, the method comprising:
    providing a substrate comprising a target structure having a first region and a second region;
    grounding the second region;
    scanning the substrate using a scanning electron microscope to produce a voltage contrast (VC) image;
    determining a gray level of the first region in the VC image; and
    using the gray level to determine a leakage current between the first region and the second region.

2. The method of claim 1, wherein the second region is virtually grounded.

3. The method of claim 1, wherein during the step of scanning, a period of time for scanning a pixel multiplied by a scanning current has a value of between about $1 \text{ nA}*10^{-9}$ seconds and about $100 \text{ nA}*10^{-9}$ seconds.

4. The method of claim 1 wherein the step of using the gray level to determine the leakage current comprises a calibration process to construe a correlation between gray levels and leakage currents, wherein the calibration process comprises:
    selecting sample structures substantially similar to the target structure;
    using a scanning electron microscope to produce VC images of the sample structures;
    determining gray levels of the sample structures from the VC images;
    measuring leakage currents of the sample structures; and
    establishing the correlation using the gray levels and the leakage currents.

5. The method of claim 4, wherein the sample structures are selected from different wafers.

6. The method of claim 4, wherein the sample structures are formed on a sample wafer.

7. The method of claim 1, wherein the first region and the second region form a p-n junction.

8. The method of claim 1 further comprising forming a contact plug connected to the first region before the step of scanning, wherein a gray level of the contact plug is used to determine the leakage current.

9. The method of claim 1, wherein the first region is over the second region.

10. The method of claim 1, wherein the first region and the second region are positioned horizontally.

11. A method for determining leakage currents in a metal-oxide-semiconductor device, the method comprising:
    providing a substrate comprising a MOS device;
    grounding the substrate;
    scanning the substrate using a scanning electron microscope to produce a voltage contrast (VC) image;
    determining gray levels of a gate electrode and source/drain regions of the MOS device from the VC image; and
    using the gray levels to determine leakage currents of the gate electrode and the source/drain regions.

12. The method of claim 11, wherein the step of using the gray levels to determine leakage currents comprises:
    selecting a plurality of sample MOS devices having a structure similar to the MOS device;
    determining sample gray levels of the sample MOS devices;
    measuring sample leakage currents of the sample MOS devices;
    construing a correlation between the sample gray levels and the sample leakage currents; and
    determining the leakage currents using the correlation and the gray levels.

13. The method of claim 11, wherein each of the gate electrode and the source/drain regions has an area of less than about $0.05 \text{ }\mu m^2$.

14. The method of claim 11, wherein the scanning is performed using an eBeam having a landing energy of greater than 50 eV and less than a maximum allowable landing energy.

15. The method of claim 11, wherein the scanning is performed using an eBeam having a scanning current of between about 1 nA and about 100 nA.

16. The method of claim 11 further comprising forming contact plugs connected to the gate electrode and the source/drain regions before the step of scanning, wherein gray levels of the contact plugs are used to determine the leakage currents.

17. The method of claim 16 further comprising:
    grounding one of the contact plugs;
    determining additional gray levels of the contact plugs from the VC images; and
    determining additional leakage currents between the contact plugs using the additional gray levels.

18. A method for determining leakage currents in integrated circuits, the method comprising:
    providing a first feature and a second feature substantially similar to the first feature;
    scanning the first feature and the second feature using an eBeam to produce VC images;
    determining a first gray level of the first feature and a second gray level of the second feature from the VC images;
    measuring a first leakage current of the first feature; and
    determining a second leakage current of the second feature using the first leakage current and a ratio of the first gray level to the second gray level.

19. The method of claim 18 further comprising:
    providing a third feature substantially similar to the first feature;
    scanning the third feature using an eBeam to produce an additional VC image;
    determining a third gray level of the third feature from the additional VC image, wherein the second gray level is between the first and the second gray levels; and
    determining a third leakage current of the third feature to be between the first and the second leakage currents.

* * * * *